(12) United States Patent
Jeong et al.

(10) Patent No.: US 7,180,790 B2
(45) Date of Patent: Feb. 20, 2007

(54) NON-VOLATILE MEMORY DEVICE HAVING CONTROLLED BULK VOLTAGE AND METHOD OF PROGRAMMING SAME

(75) Inventors: Jae-Yong Jeong, Yongin-si (KR); Heung-Soo Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 118 days.

(21) Appl. No.: 11/133,347

(22) Filed: May 20, 2005

(65) Prior Publication Data

US 2006/0087890 A1 Apr. 27, 2006

(30) Foreign Application Priority Data

Oct. 21, 2004 (KR) .................... 10-2004-0084485

(51) Int. Cl.
*G11C 7/10* (2006.01)
(52) U.S. Cl. .................... 365/189.01; 365/185.27; 365/185.18
(58) Field of Classification Search .......... 365/185.27, 365/185.18, 189.01, 185.23, 189.09, 189.11, 365/226
See application file for complete search history.

(56) References Cited

U.S. PATENT DOCUMENTS 5,999,475 A * 12/1999 Futatsuya et al. .......... 365/226
6,927,620 B2 * 8/2005 Senda ....................... 327/536

FOREIGN PATENT DOCUMENTS

| JP | 09-213079 | 8/1994 |
| JP | 2000-243095 | 9/2000 |
| KR | 1020000030505 A | 6/2000 |
| KR | 1020000026170 A | 5/2002 |
| KR | 1020020039744 A | 5/2002 |

* cited by examiner

*Primary Examiner*—Anh Phung
*Assistant Examiner*—Dang Nguyen
(74) *Attorney, Agent, or Firm*—Volentine & Whitt, PLLC

(57) ABSTRACT

Disclosed is a non-volatile memory device and a method of programming the same. The non-volatile memory device is programmed by applying a wordline voltage, a bitline voltage, and a bulk voltage to memory cells within the device. During a programming operation for the device, the bulk voltage is generated by a first pump. However, where the bulk voltage exceeds a predetermined detection voltage, a second pump is further activated in order to lower the bulk voltage.

17 Claims, 4 Drawing Sheets

NON-VOLATILE MEMORY DEVICE HAVING CONTROLLED BULK VOLTAGE AND METHOD OF PROGRAMMING SAME

BACKGROUND OF THE INVENTION

1. Field of the Invention

The present invention relates generally to an electronic memory device. More particularly, the invention relates to a non-volatile memory device and a method of programming the same.

A claim of priority is made to Korean Patent Application No. 10-2004-0084485 filed on Oct. 21, 2004, the disclosure of which is hereby incorporated by reference in its entirety.

2. Description of the Related Art

Semiconductor memories are an essential part of most modern electronic systems such as computers and other digital logic platforms. Unfortunately, however, the performance of the electronic systems is often limited by the speed and the capacity of the semiconductor memories. In addition, the physical size of memory chips often places a restriction on the amount of miniaturization that can take place in the electronic systems. Because of the limiting effect that semiconductor memories have on modern electronic systems, there is a continuing need to create faster, more highly integrated semiconductor memories. In order to do so, improvements need to be made to the manufacturing technologies used to create these memories. In particular, processing techniques for creating more densely integrated, higher frequency semiconductor memories need to be developed.

Semiconductor memory devices are generally grouped into two broad categories: volatile semiconductor memory devices and non-volatile semiconductor memory devices. Briefly, volatile semiconductor memory devices provide persistent data storage as long as power is supplied to the devices, but they lose the data once the power is cut off. Non-volatile semiconductor memory devices, on the other hand, provide persistent data storage even when power to the devices is cut off or suspended.

Because of their ability to provide persistent data storage even when power is cut off, non-volatile memory devices are commonly used to provide long term storage for data such as program files and microcode. Non-volatile memory devices are frequently used in application areas such as personal computers, aerospace electronic engineering, communication systems, and consumer electronics.

Some non-volatile semiconductor memories are adapted for reprogramming and others are not. For example, due to design limitations, mask-programmed read-only memory (MROM) and programmable read-only memory (PROM) can be programmed only once during their lifetime. Erasable programmable read-only memory (EPROM) can be reprogrammed, but only after exposing it to ultraviolet light for several minutes to erase previously stored data. Electrically erasable programmable read-only memory (EEPROM), on the other hand, provides efficient reprogramming capability by allowing memory cells to be reprogrammed by simply applying electric fields to the cells. EEPROMs can generally be reprogrammed more than one hundred thousand times during their lifetime.

Flash memory is a special type of EEPROM in which multiple memory blocks are erased or programmed by a single programming operation. The performance of flash memory is generally superior to that of normal EEPROM, which only allows one memory block to be erased or programmed at a time. In addition, flash memory provides fast access times for read operations and is resistant to physical shock, thus making it an attractive option for high performance portable devices such as cellular phones and personal digital assistants (PDAs).

A typical flash memory comprises an array of transistors called cells, wherein each cell has a source and a drain formed on a substrate and two gate structures formed on the substrate between the source and the drain terminals. The two gate structures generally comprise a floating gate surrounded by an insulating layer and a control gate formed on the floating gate. The floating gate is used to store electrons determining a logic state for the cell.

A flash memory cell is read by placing a voltage on its control gate and detecting whether a current flows between its drain and source. Depending on how many electrons are stored in the floating gate, the voltage applied to the control gate will either allow current to flow between the drain and the source or it will not. For example, where a large number of electrons is stored in the floating gate, the electrons have a canceling effect on the voltage applied to the control gate, thereby affecting whether current flows between the drain and the source. In other words, the electrons stored in the floating gate modify the threshold voltage of the cell, i.e. the voltage that has to be applied to the control gate in order for current to flow between the drain and the source.

Due to variations in flash memory cells such as their geometry or a voltage used to program the memory cells, there tends to be variation in the threshold voltages of flash memory cells that have been programmed. Where the variation in the threshold voltages of the memory cells is not properly regulated, it can cause the flash memory to have poor performance.

In order to regulate a threshold voltage distribution for programmed memory cells, the memory cells are generally programmed using an incremental step pulse programming (ISPP) scheme such as that illustrated by FIG. 1. Referring to FIG. 1, a programming voltage $V_{WL}$ is applied to a wordline. Programming voltage $V_{WL}$ is increased in multiple programming loop iterations executed during a programming operation. Each programming loop comprises a programming period and a program verifying period. In each programming loop, programming voltage $V_{WL}$ is incremented by an amount $\Delta V$. During the programming operation, a threshold voltage Vt of a cell being programmed increases by amount $\Delta V$ in each programming loop. In order to minimize variation in the threshold voltage distribution, amount $\Delta V$ should be small. As increment $\Delta V$ becomes smaller, the number of programming loops becomes larger. Since there is a tradeoff between the number of programming loops required and the variance of the threshold voltage distribution, $\Delta V$ should be chosen to minimize the variance of the threshold voltage as much as possible without significantly limiting the performance of the memory device by requiring too many programming loops.

A programming scheme for a non-volatile memory device using ISPP is disclosed, for example, in U.S. Pat. No. 6,266,270. Circuits for generating programming voltages using ISPP are disclosed, for example, in U.S. Pat. No. 5,642,309 and in Korean Patent Publication No. 2002-39744.

In programming a NOR flash memory device using the ISPP scheme, a wordline voltage of 10V is applied to the control gate of a flash memory cell, a bitline voltage of 5~6V is applied to the drain of the flash memory cell, and a voltage less than 0V (e.g., −1V) is applied to the bulk (or substrate) of the flash memory cell. In general, a current $I_{cell}$ flowing through the flash memory cell is $(V_{GS}-Vt)^2$, where Vt is proportional to a threshold voltage of the flash memory cell and $V_{GS}$ is a gate-to-source voltage of the flash memory cell.

The voltage applied to the bulk is typically generated and maintained by a charge pump (not shown). Raising the bulk voltage increases the threshold voltage of a cell, which leads to an increase in current $I_{cell}$. As current $I_{cell}$ increases, a drain voltage is decreased accordingly. As the drain voltage decreases, the threshold voltage of the flash memory cell is not increased as much as desired during each programming loop iteration, as indicated by a broken line in FIG. 1.

Under these conditions, the difference between the wordline voltage and the threshold voltage becomes progressively larger as more programming loop iterations are executed using the ISPP scheme. As a result, the quality of programming gradually degrades to the point where programming failures occur.

What is needed, therefore, is a way to prevent programming failures from occurring due to an increase in the bulk voltage.

SUMMARY OF THE INVENTION

One object of the present invention is to provide a non-volatile memory device that prevents programming failures from occurring due to an increase in a bulk voltage.

Another object of the present invention is to provide a non-volatile memory device capable of controlling the current driving capability of a pump providing a bulk voltage during programming operations.

According to one embodiment of the present invention, a method of programming a non-volatile memory device is provided. The method comprises generating a bulk voltage using a first pump, detecting whether or not the bulk voltage is higher than a detection voltage after the bulk voltage reaches a target bulk voltage, and activating a second pump to generate the bulk voltage in cases where the bulk voltage becomes higher than the detection voltage.

According to another embodiment of the present invention, a non-volatile memory device is provided. The non-volatile memory device comprises a memory cell and a bulk voltage generating circuit. The bulk voltage generating circuit is adapted to generate a bulk voltage to be provided to a bulk of the memory cell. The bulk voltage generating circuit has a current driving capability that varies according to whether the bulk voltage is higher than a detection voltage during a programming section of a programming operation.

Typically, the bulk voltage generating circuit comprises a first pump and a second pump, a first detector detecting whether the bulk voltage reaches a target bulk voltage during the programming operation, a second detector detecting whether the bulk voltage is higher than the detection voltage while a bitline voltage is provided to a bitline of the memory cell, and a pump controller controlling the first and second pumps in response to outputs of the first and second detectors. The pump controller controls the first and second pumps to operate simultaneously in cases where the bulk voltage is higher than the detection voltage during the programming section.

According to still another embodiment of the present invention, a non-volatile memory device is provided. The non-volatile memory device comprises a memory cell array having memory cells arranged into rows and columns, a write driver circuit providing selected columns with a bitline voltage according to input data in response to a bitline enable signal during a programming operation, and a bulk voltage generating circuit generating a bulk voltage to be provided to a bulk of the memory cells. The bulk voltage generating circuit detects whether the bulk voltage is higher than a detection voltage while the bitline enable signal is activated and then varies a current driving capability of the bulk voltage generating circuit according to whether the bulk voltage is higher than the detection voltage.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
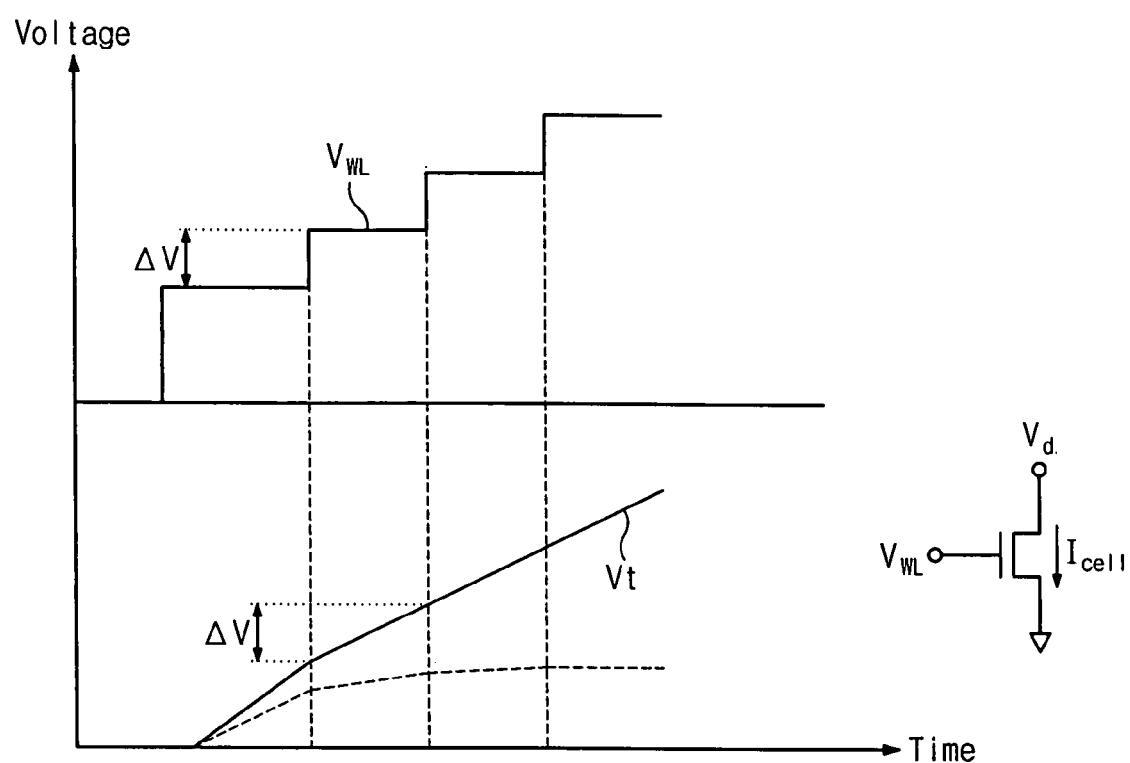
FIG. 1 is a graph showing variation in wordline and threshold voltages during a programming operation of a non-volatile memory device.
Figure 2:
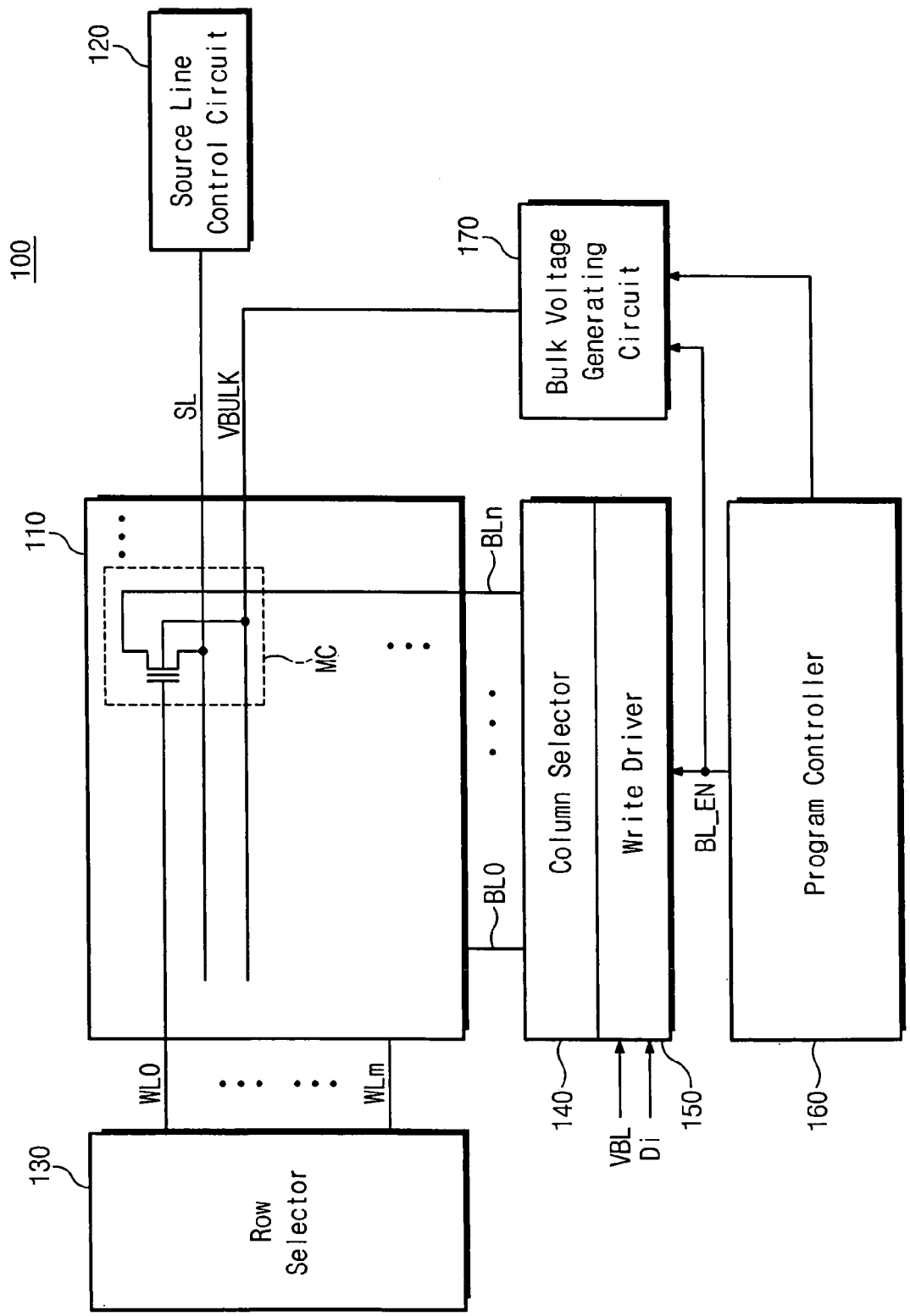
FIG. 2 is a schematic block diagram of a non-volatile memory device according to one embodiment of the present invention.

FIG. 2 is a schematic block diagram of a non-volatile memory device according to one embodiment of the present invention. Although the non-volatile memory device shown in FIG. 2 is a NOR flash memory device, the invention can also be embodied by other types of non-volatile memory, such as masked read-only memory (MROM), programmable read-only memory (PROM), ferroelectric random-access memory (FRAM), NAND flash memory, etc.

Referring to FIG. 2, a non-volatile memory device 100 comprises a memory cell array 110 including a plurality of memory cells arranged in a matrix along rows (wordlines) and columns (bitlines). In FIG. 2, only one of the plurality of memory cells, i.e., a memory cell MC, is shown. However, other memory cells contained in memory cell 110 have a similar configuration to memory cell MC.

Memory cell MC comprises a floating gate transistor having a floating gate, a control gate, a bulk, a source, and a drain. The control gate, the drain, and the source of the floating gate transistor are respectively connected to a wordline WL0, a source line SL, and a bitline BLn. Source line SL is controlled by a source line control circuit 120. Source line SL is set to ground during a read or program operation and it is set to a floating state during an erase operation. The bulk of the floating gate transistor receives a bulk voltage VBULK from a bulk voltage generating circuit 170.

A row selection circuit 130 selects one of wordlines WL0–WLm according to predetermined row address information and then drives the selected wordline with a predetermined wordline voltage. A column selection circuit 140 selects a number of bitlines BL0–BLn (e.g., a word or a byte) according to predetermined column address information and a write driver circuit 150 drives the selected bitlines during a programming operation with a bitline voltage VBL according to input data Di. In other words, where input data Di comprises data to be programmed to memory cell 110, write driver circuit 150 drives the selected bitlines with bitline voltage VBL. In contrast, where input data Di comprises a voltage used to inhibit programming of memory cell array 110, write driver circuit 150 drives the selected bitline to a voltage (e.g., ground) that is lower than bitline voltage VBL. A program control circuit 160 activates (i.e. sets to a first logic state) a bitline enable signal BL_EN during each programming operation, and write driver circuit 150 drives the selected bitlines to bitline voltage VBL or ground while bitline enable signal BL_EN is activated.

A bulk voltage generating circuit 170 generates a bulk voltage VBULK in response to a control signal from program control circuit 160. The current driving capability of bulk voltage generating circuit 170 varies according to bulk voltage VBULK during each programming operation. In particular, bulk voltage generating circuit 170 has a first current driving capability in cases where bulk voltage VBULK is less than a predetermined detection voltage and a second current driving capability in cases where bulk voltage VBULK is greater than the predetermined detection voltage. The detection voltage is typically chosen to be higher than a target bulk voltage, i.e. a target voltage for the bulk voltage (e.g., −1V), and lower than ground. Varying the current driving capability of bulk voltage generating circuit 170 in this way prevents bulk voltage VBULK from being excessively raised during a programming operation, thereby preventing programming failures from occurring.

By preventing bulk voltage VBULK from being excessively raised during programming operations, a threshold voltage for a memory cell is raised by a desired amount during each programming operation, thereby preventing programming failures from occurring. An exemplary technique for varying the current driving capability of the bulk voltage generating circuit 170 will now be described with reference to FIG. 3.

Figure 3:
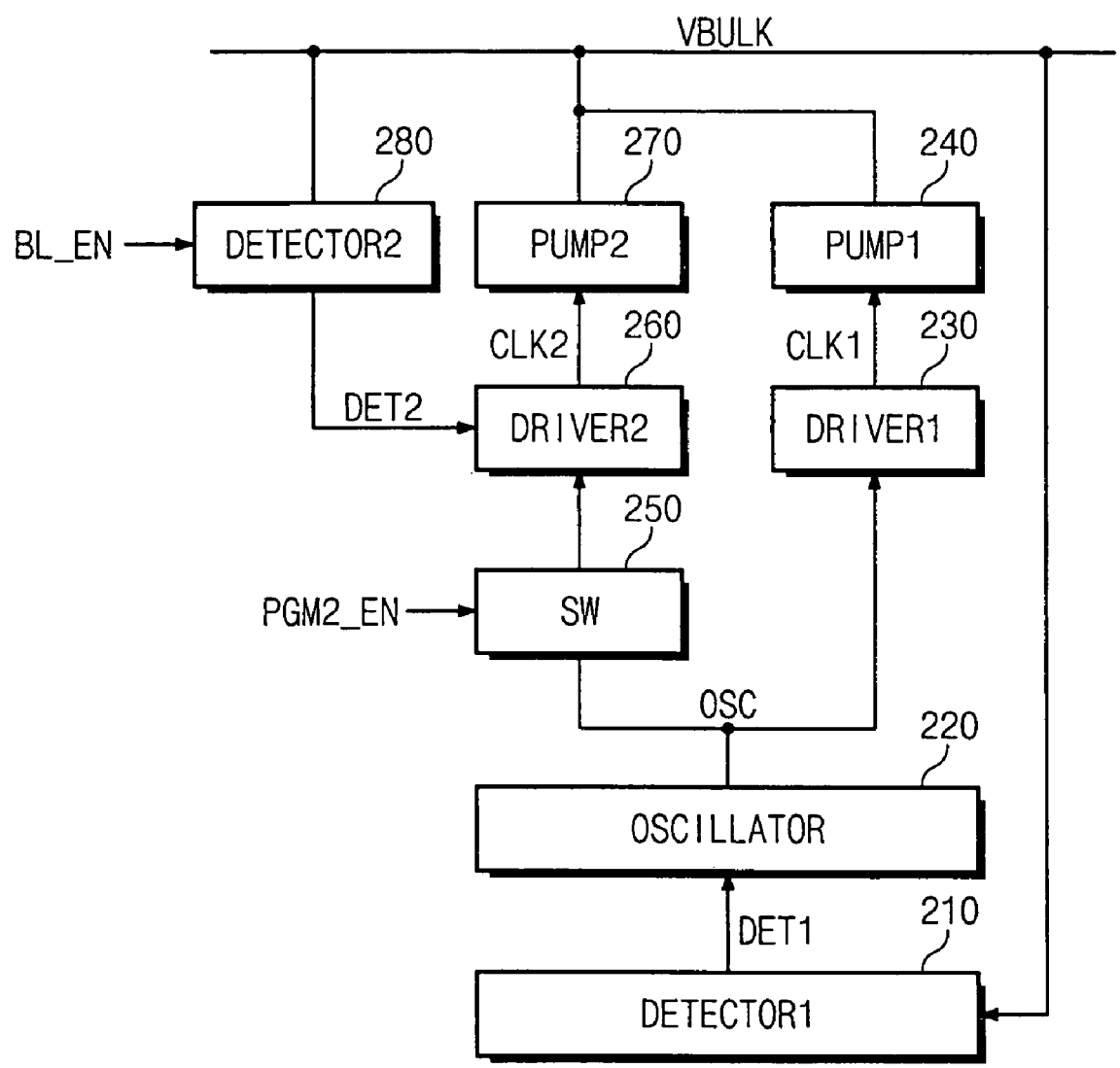
FIG. 3 is a schematic block diagram illustrating a bulk voltage generating circuit shown in FIG. 2 according to one embodiment of the present invention; and, FIG. 4 is a waveform timing diagram illustrating a programming operation for a non-volatile memory device according to an embodiment of the present invention.

FIG. 3 is a schematic block diagram illustrating bulk voltage generating circuit 170 shown in FIG. 2 according to one embodiment of the present invention.

Referring to FIG. 3, bulk voltage generating circuit 170 comprises a first detector 210, an oscillator 220, a first clock driver 230, a first pump 240, a switch 250, a second clock driver 260, a second pump 270, and a second detector 280.

First detector 210 receives bulk voltage VBULK and generates a detection signal DET1 that is either activated or inactivated (i.e. set to a second logic state) depending on whether bulk voltage VBULK has reached (e.g., is less than or equal to) the target bulk voltage. For example, in a case where bulk voltage VBULK has not reached the target bulk voltage, first detector 210 activates detection signal DET1 and where bulk voltage VBULK has reached the target bulk voltage, first detector 210 inactivates detection signal DET1. In this way, the bulk voltage is maintained roughly between the target bulk voltage and the detection voltage during programming operations.

Oscillator 220 generates an oscillation signal OSC in response to the activation of detection signal DET1. Where detection signal DET1 is inactivated, oscillation signal OSC is no longer generated.

First clock driver 230 generates a pump clock signal CLK1 in response to oscillation signal OSC, and first pump 240 performs a pump operation in response to pump clock signal CLK1. As first pump 240 is operated, bulk voltage VBULK gradually decreases to the target bulk voltage. Switch 250 transfers oscillation signal OSC to second clock driver 260 in response to a control signal PGM2_EN.

Control signal PGM2_EN becomes activated when bulk voltage VBULK reaches the target bulk voltage. Control signal PGM2_EN becomes inactivated when a bitline voltage VBL supplied to selected bitlines is discharged or when bitline enable signal BL_EN is inactivated.

Second detector 280 receives bulk voltage VBULK and generates a detection signal DET2 that is activated or inactivated depending on whether bulk voltage VBULK is above the detection voltage. For example, where bulk voltage VBULK is lower than the detection voltage, second detector 280 inactivates detection signal DET2 and where bulk voltage VBULK is higher than the detection voltage, second detector 280 activates detection signal DET2.

Second detector 280 is controlled by bitline enable signal BL_EN so that it produces detection signal DET2, only when bitline enable signal BL_EN is activated. Bitline enable signal BL_EN is output by program control circuit 160 of FIG. 2 and is activated only when bitline voltage VBL is supplied during a programming operation.

Second clock driver 260 generates a pump clock signal CLK2 in response to detection signal DET2 and oscillation signal OSC. For instance, where detection signal DET2 is inactivated, second clock driver 260 does not generate pump clock signal CLK2 even if it has received oscillation signal OSC. This in turn causes second pump 270 to not operate. Where detection signal DET2 is activated, second clock driver 260 generates pump clock signal CLK2 in response to oscillation signal OSC, thereby causing second pump 270 to operate.

In sum, where bulk voltage VBULK is between the target bulk voltage and the detection voltage, it is generated and maintained by first pump 240. Where bulk voltage VBULK is higher than the detection voltage, it is generated and maintained by respective first and second pumps 240 and 270.

In FIG. 3, oscillator 220, first clock driver 230, switch 250, and second clock driver 260 form a pump controller. The pump controller controls first and second pumps 240 and 270 in response to outputs from first and second detectors 210 and 280. In FIG. 3, second detector 280 is operated whenever bitline enable signal BL_EN is activated. It is possible, however, for second detector 280 to be operated during every programming operation.

Figure 4:
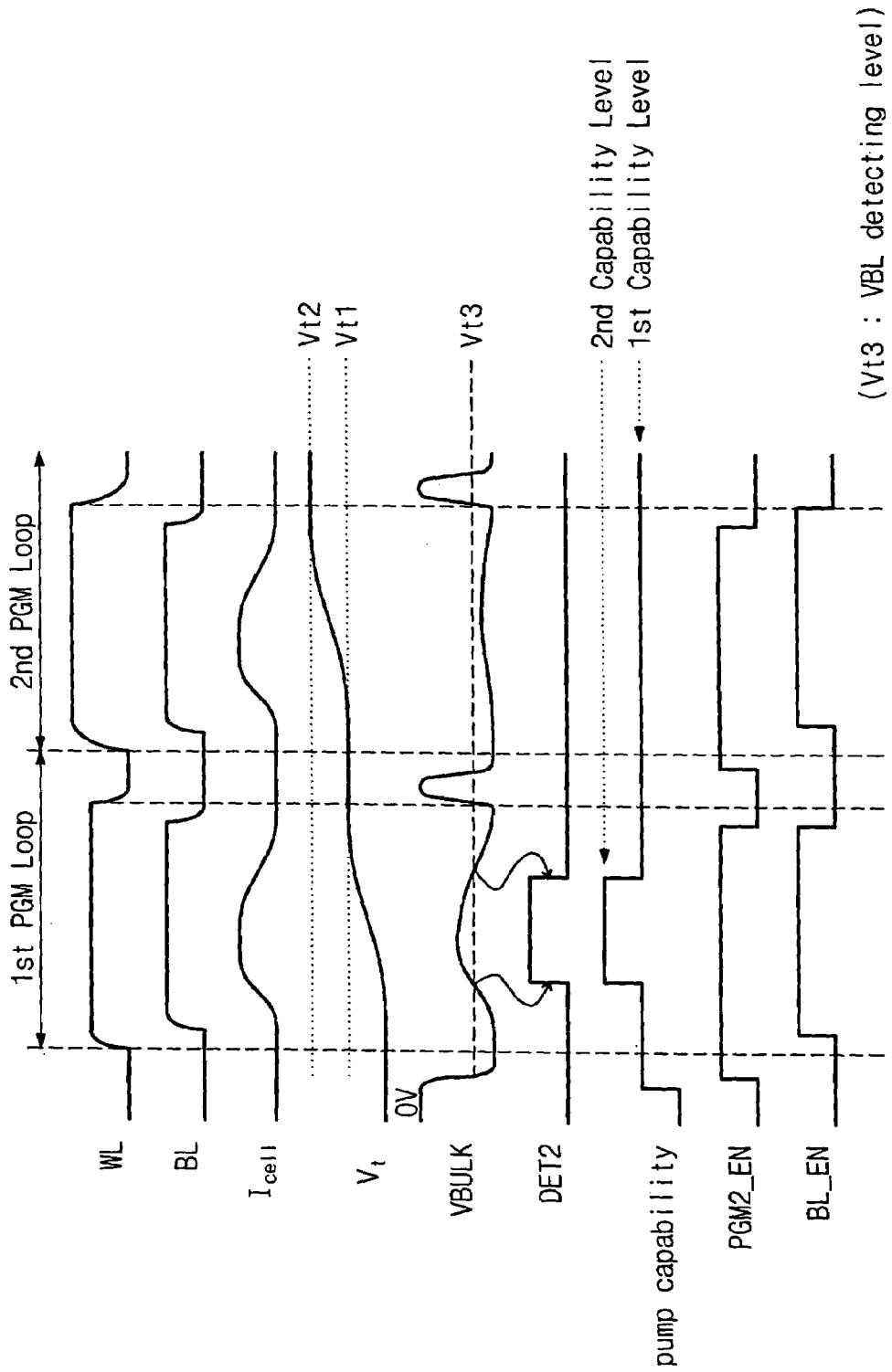

FIG. 4 is a waveform timing diagram illustrating the operation of non-volatile memory device 100 according one embodiment of the present invention. In particular, FIG. 4 illustrates a programming operation for the non-volatile memory device. A programming operation for a non-volatile memory device comprises a plurality of programming loops, wherein each programming loop comprises a programming section and a verification section. In cases where a non-volatile memory device uses an ISPP scheme, a wordline voltage is incrementally increased by a predetermined value for each programming loop. In cases where a non-volatile memory device does not use an ISPP scheme, the wordline voltage is maintained constant throughout all programming loops.

In a programming operation, non-volatile memory device 100 first enters a programming operation mode and bulk voltage generating circuit 170 starts generating bulk voltage VBULK in response to the control signal from program control circuit 160. More particularly, first detector 210 detects whether bulk voltage VBULK has reached the target bulk voltage or not. Where bulk voltage VBULK has not reached the target bulk voltage, detection signal DET1 is activated by first detector 210. Oscillator 220 generates oscillation signal OSC in response to the activation of detection signal DET1 and then a pump operation is started in response to pump clock signal CLK1, which is provided to first pump 240 by clock driver 230, thereby causing bulk voltage VBULK to decrease toward the target bulk voltage (−1V). These operations are continued until bulk voltage VBULK reaches the target bulk voltage.

Where bitline enable signal BL_EN is inactivated, second detector 280 does not operate. Similarly, where control signal PGM2_EN is inactivated, switch 250 does not transfer oscillation signal OSC to second clock driver 260. As a result, where bulk voltage VBULK is below the detection voltage, second pump 270 does not operate.

Referring to FIG. 4, where bulk voltage VBULK has reached the target bulk voltage using first pump 240 at least once, program control circuit 160 activates control signal PGM2_EN. Once control signal PGM2_EN is activated, oscillation signal OSC is supplied to second clock driver 260 via switch 250. However, even in cases where oscillation signal OSC is supplied to second clock driver 260, second pump 270 is not operated due to inactivation of detection signal DET2.

Where bulk voltage VBULK reaches the target bulk voltage using first pump 240, row selection circuit 130 provides a wordline voltage to the selected wordline. Thereafter, program control circuit 160 activates bitline enable signal BL_EN. Write driver circuit 150 provides bitline voltage VBL to the selected bitline in response to the activation of bitline enable signal BL_EN. Where the wordline voltage, bitline voltage VBL, and bulk voltage VBULK are provided to the wordline, the bitline, and the bulk, respectively, the memory cell is programmed. As the memory cell is programmed, as shown in FIG. 4, a threshold voltage Vt of the memory cell slowly increases to a target voltage Vt1 for the first programming loop.

At the same time, second detector 280 of bulk voltage generating circuit 170 is operated in response to the activation of bitline enable signal BL_EN. In other words, second detector 280 detects whether bulk voltage VBULK is higher than a detection voltage Vt3, which is higher than the target bulk voltage and lower than ground. Where bulk voltage VBULK is lower than detection voltage Vt3, second detector 280 inactivates detection signal DET2, thereby preventing second clock driver 260 from providing oscillation signal OSC to second pump 270. In an event where bulk voltage VBULK is higher than detection voltage Vt3, as shown in FIG. 4, second detector 280 activates detection signal DET2. As detection signal DET2 becomes activated, second clock driver 260 outputs pump clock signal CLK2 to second pump 270 in response to oscillation signal OSC. As such, second pump 270 performs a pump operation, thereby reducing bulk voltage VBULK below detection voltage Vt3. Where bulk voltage VBULK again becomes lower than detection voltage Vt3, detection signal DET2 is inactivated. Accordingly, second pump 270 no longer operates.

The operation of bulk voltage generating circuit 170 mentioned above is repeated during each subsequent programming section so as to maintain bulk voltage VBULK below detection voltage Vt3. As a result, an explanation of the subsequent programming sections will be omitted.

Where bulk voltage VBULK is higher than detection voltage Vt3, first and second pumps 240 and 270 are operated, and thereby increasing the current driving capability of bulk voltage generating circuit 170. Where bulk voltage VBULK is increased to detection voltage Vt3 or above, bulk voltage VBULK is efficiently lowered by simultaneously operation of first and second pumps 240 and 270. Where bulk voltage VBULK is lowered to below detection voltage Vt3, bulk voltage VBULK is maintained and generated by the first pump in the manner above-described. Although the bulk voltage generating circuit in the exemplary embodiment described above uses two pumps, it is possible for more pumps to be provided.

As previously mentioned, programming failures caused by an elevated bulk voltage are prevented by increasing a current driving voltage when the bulk voltage exceeds a detection voltage.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A method of programming a non-volatile memory device, the method comprising:
   generating a bulk voltage using a first pump;
   detecting whether or not the bulk voltage is higher than a detection voltage after the bulk voltage has reached a target bulk voltage; and,
   activating a second pump to generate the bulk voltage in cases where the bulk voltage becomes higher than the detection voltage.

2. The method of claim 1, wherein the first and second pumps are operated simultaneously whenever the bulk voltage is higher than the detection voltage during a programming section of a programming operation.

3. The method of claim 1, wherein the second pump is only operated in cases where the bulk voltage has been detected to be higher than the detection voltage.

4. The method of claim 1, wherein detecting whether or not the bulk voltage is higher than the detection voltage only occurs while a bitline voltage is provided to a bitline.

5. The method of claim 1, further comprising:
   inactivating the second pump when the bulk voltage becomes lower than the detection voltage in each programming section of the programming operation.

6. A non-volatile memory device, comprising:
   a memory cell; and,
   a bulk voltage generating circuit adapted to generate a bulk voltage to be provided to a bulk of the memory cell;
   wherein a current driving capability of the bulk voltage generating circuit varies according to whether the bulk voltage is higher than a detection voltage in a programming section of a programming operation.

7. The non-volatile memory device of claim 6, wherein the bulk voltage generating circuit comprises:
   a first pump and a second pump;
   a first detector detecting whether the bulk voltage reaches a target voltage during the programming operation;
   a second detector detecting whether the bulk voltage is higher than the detection voltage while a bitline voltage is provided to a bitline of the memory cell; and,
   a pump controller controlling the first and second pumps in response to outputs from the first and second detectors;
   wherein the pump controller controls the first and second pumps to operate simultaneously in cases where the bulk voltage is higher than the detection voltage during the programming section.

8. The non-volatile memory device of claim 7, wherein the target voltage is lower than the detection voltage.

9. The non-volatile memory device of claim 7, wherein the second pump only operates while the bitline voltage is provided to the bitline.

10. The non-volatile memory device of claim 7, wherein the pump controller comprises:
    an oscillator generating an oscillation signal in response to a first detection signal output by the first detector;
    a first clock driver generating a second pump clock signal to be provided to the first pump in response to the oscillation signal;
    a switch receiving and outputting the oscillation signal in response to a control signal; and,
    a second clock driver generating a second pump clock signal to be provided to the second pump in response to an oscillation signal transferred by the switch and a second detection signal output by the second detector.

11. The non-volatile memory device of claim 10, wherein the control signal is activated when the bulk voltage reaches the target voltage; and,
    wherein the control signal is inactivated when the bitline voltage is discharged.

12. A non-volatile memory device, comprising:
    a memory cell array comprising memory cells arranged into rows and columns;
    a write driver circuit providing selected columns with a bitline voltage according to input data in response to a bitline enable signal during a programming operation; and,
    a bulk voltage generating circuit generating a bulk voltage to be provided to a bulk of the memory cells;
    wherein the bulk voltage generating circuit detects whether the bulk voltage is higher than a detection voltage in response to an activation of the bitline enable signal and then varies a current driving capability of the bulk voltage generating circuit according to whether the bulk voltage is higher than the detection voltage.

13. The non-volatile memory device of claim 12, wherein the bulk voltage generating circuit includes:
    a first pump and a second pump;
    a first detector detecting whether the bulk voltage reaches a target voltage;
    a second detector detecting whether the bulk voltage is higher than the detection voltage, the second detector operating in response to the bitline enable signal; and,
    a pump controller controlling the first and second pumps in response to outputs from the first and second detectors;
    wherein the pump controller controls the first and second pumps to operate simultaneously in cases where the bulk voltage is higher than the detection voltage during a programming section of the programming operation.

14. The non-volatile memory device of claim 13, wherein a target voltage for the bulk voltage is lower than the detection voltage.

15. The non-volatile memory device of claim 13, wherein the second pump is controlled by the pump controller only in cases where the bitline enable signal is activated.

16. The non-volatile memory device of claim 13, wherein the pump controller comprises:
    an oscillator generating an oscillation signal in response to a first detection signal output by the first detector;
    a first clock driver generating a second pump clock signal to be provided to the first pump in response to the oscillation signal;
    a switch receiving and outputting the oscillation signal in response to a control signal; and,
    a second clock driver generating a second pump clock signal to be provided to the second pump in response to the oscillation signal output by the switch and a second detection signal output by the second detector.

17. The non-volatile memory device of claim 16, wherein the control signal is activated whenever the bulk voltage reaches the target voltage; and,
    wherein the control signal is inactivated whenever the bitline enable signal is inactivated.

* * * * *